Oct. 16, 1956 C. C. MARTINELLI 2,767,313

FREQUENCY DIVIDER

Filed March 28, 1952 2 Sheets-Sheet 1

INVENTOR
Ciro C. Martinelli
BY Morris L. Rabkin
ATTORNEY

Oct. 16, 1956 C. C. MARTINELLI 2,767,313

FREQUENCY DIVIDER

Filed March 28, 1952 2 Sheets-Sheet 2

INVENTOR
Ciro C. Martinelli
BY Morris L. Rabkin
ATTORNEY

United States Patent Office 2,767,313

Patented Oct. 16, 1956

2,767,313

FREQUENCY DIVIDER

Ciro C. Martinelli, Princeton, N. J., assignor to Radio Corporation of America, a corporation of Delaware Application March 28, 1952, Serial No. 279,130

7 Claims. (Cl. 250—27)

Figure 1:
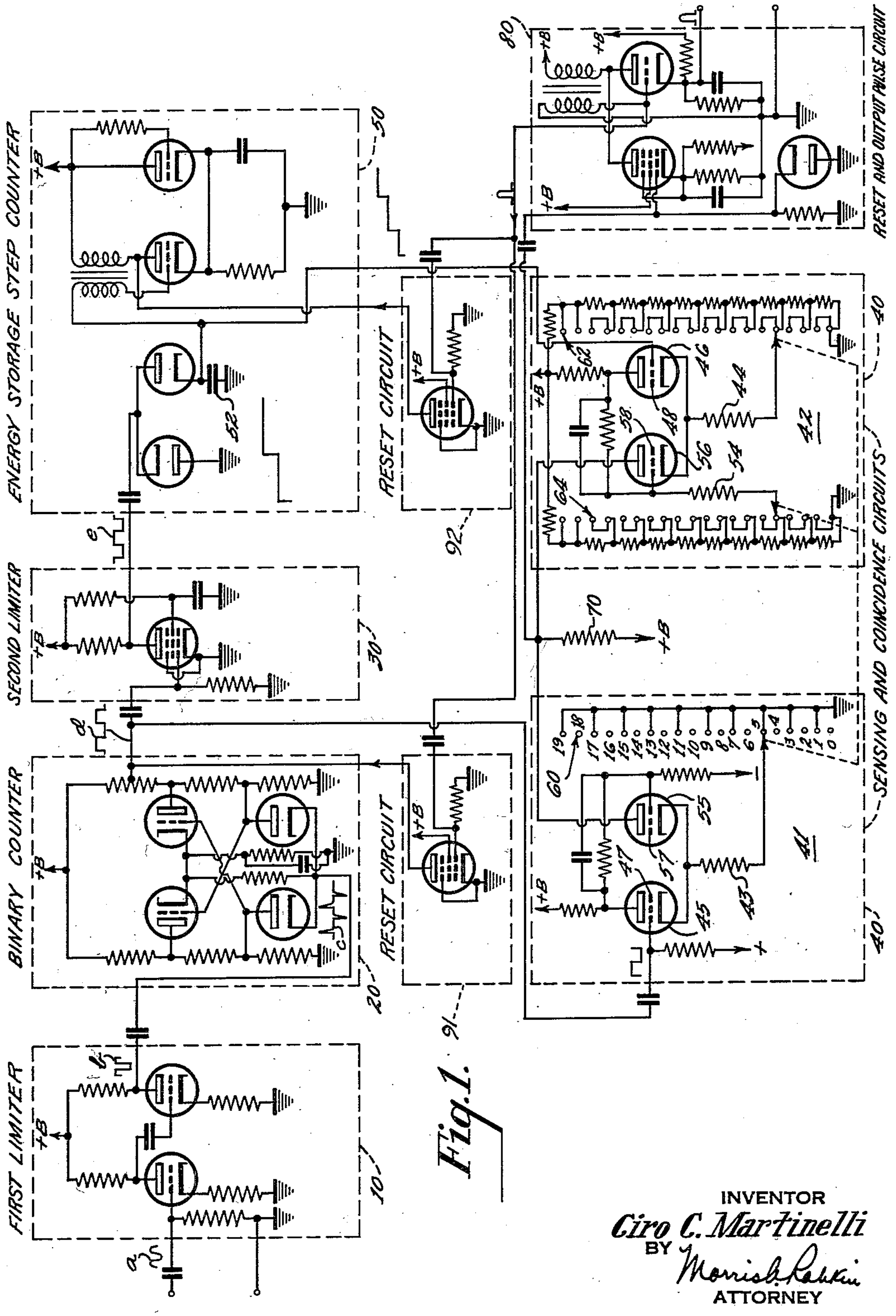

This invention relates to predetermined counters and, more particularly, is an improved predetermined counter type of frequency divider utilizing energy storage step counters.

In Patent No. 2,563,123 for "Counter Circuit," issued August 7, 1951, to D. G. C. Luck et al., there is shown and described an improved electronic predetermined counter system of the energy storage step type. Such a counter is sufficiently stable and accurate for use as a frequency divider designed to provide a submultiple output frequency which is a predetermined fraction of the input frequency. For example, this type of frequency divider may be used in multichannel receivers to provide local oscillator frequencies over a plurality of decimally divided subchannel scales such as: 0–900 kc., 0–90 kc. and 0–9 kc.

In many applications of such frequency dividers, it is desirable to divide a given frequency scale into additional one-half steps. For example, it may be desirable to subdivide a 0–9 kc. scale into one-half kc. steps so that it is possible to obtain a submultiple frequency such as, for example, 8.5 kc. It is not practical to do this by increasing the number of energy storage steps associated with the 0–9 kc. scale from 10 to 20, since the energy storage counter tends to become unstable as the number of steps is increased. It is possible to solve this problem by adding another energy storage step counter having two steps. This, however, would unnecessarily complicate the circuitry.

It is an object of the present invention to provide a stable frequency divider or predetermined counter of the energy storage step counter type which is designed to subdivide an input frequency into additional one-half fractions without additional energy storage step counter stages.

It is a further object of the present invention to provide a novel and improved predetermined counter or frequency divider which is simple, inexpensive and has a broad counting or frequency dividing range.

These and other objects of the present invention are achieved by utilizing a binary or scale-of-two counter and an energy storage step counter. Input pulses having a frequency which is to be subdivided are applied to the binary counter. The binary counter output is applied to the energy storage counter. Adjustable means are provided for detecting a predetermined count in the energy storage counter and for detecting one of the two binary counts. A coincidence circuit is provided which detects either the occurrence of a predetermined energy storage count alone or the coincidence of the predetermined binary count and a predetermined energy storage count. The output of the coincidence circuit is applied to a reset and output pulse circuit. This circuit provides the desired submultiple frequency.

In accordance with a preferred embodiment of the invention, the binary counter utilized is a two-tube flip-flop or trigger circuit of the general bistable type described in "Theory and Application of Vacuum Tubes" by Herbert J. Reich. The basic energy storage step counter utilized is of the type shown and described in patent to E. L. C. White, Patent No. 2,113,011, for "Thermionic Valve Apparatus," issued April 5, 1938. In this type of counter, pulses to be counted are applied to a storage capacitor through a diode to charge the capacitor in steps. When a predetermined charge, corresponding to a predetermined count, has been accumulated on the capacitor, a discharge device, such as a blocking oscillator, is tripped to provide an indication of the count and to discharge the capacitor to make it available for a new count. The specific energy storage step counter utilized is of the improved type described in patent to Luck, Patent No. 2,563,123. The feature of this energy storage step counter is that it is not adversely affected by power supply variations.

A sensing and a coincidence tube pair are provided for each counter. Each pair has a common cathode bias resistor to which the cathode of each tube is connected. The grid of the sensing tube in the first pair is coupled to the output terminal of the binary counter. The grids of the coincidence and sensing tubes of the first pair are connected to separate fixed biases and the common cathode bias resistor is connected to a selector switch. The position of the selector switch determines whether or not a predetermined binary count is to be detected. When additional one-half steps are not desired, the binary count is not detected and the sensing and coincidence tubes of the first pair are made inoperative. The amplitude of the fixed biases connected to the grids of the sensing and coincidence tubes in the first pair are determined so that in an operating condition, the sensing tube becomes alternately conductive and non-conductive while the coincidence tube becomes alternately non-conductive and conductive in response to alternate, positive and negative voltages received from the binary counter.

The grid of the coincidence tube of the second pair and its common cathode bias resistor are each connected to separate variable bias supplies. The amplitudes of the variable bias supplies are determined so that the sensing tube connected to the storage capacitor remains non-conductive and the coincidence tube remains conductive until a predetermined count, when the charge on the storage capacitor causes the sensing tube to become conductive and the coincidence tube to become non-conductive. The concurrence of non-conduction in the two coincidence tubes creates an output pulse which fires the reset and output pulse circuit.

Figure 2:
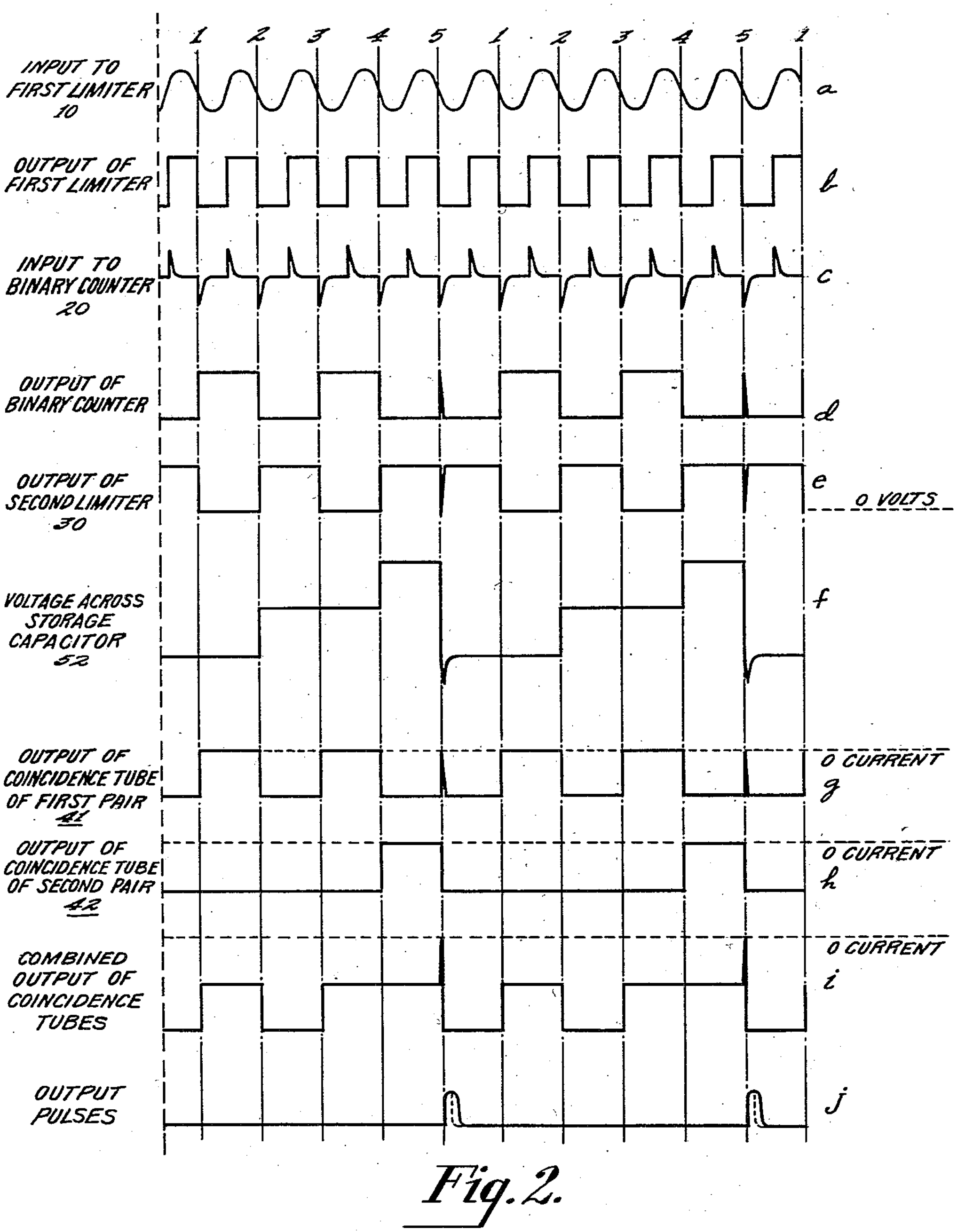

The novel features of the invention as well as the invention itself, both as to its organization and method of operation, will best be understood from the following description, when read in connection with the accompanying drawings in which, Figure 1 shows a circuit diagram of an embodiment of the present invention, Figure 2 shows the voltage wave forms which appear at various points in the circuit shown in Figure 1 during a typical operation.

Referring now to Figure 1, a signal having a sinusoidal wave shape "*a*" and a frequency which is to be subdivided is applied to the input terminals of a first limiter 10 stage. The limiter 10 provides a square-wave voltage "*b*" having the same frequency as the input signal *a*. The limiter 10 output is then differentiated and applied to a binary counter 20. The binary counter 20 is responsive only to the negative going portion of the differentiated pulses "*c*" and it provides a square-wave output voltage "*d*" which has a frequency equal to one-half of the input signal frequency. The output of the binary counter 20 is applied to a second limiter 30 which provides a square-wave voltage "*e*." The binary counter 20 output is also applied to a sensing and coincidence circuit 40 which is more fully explained below. The second limiter 30 output is applied to an energy storage step counter 50 which stores and adds successive pulses received from the second limiter 30 in a storage capacitor 52.

The sensing and coincidence circuit 40 includes two pairs of tubes 41, 42. One pair 41 has a common cathode bias resistor 43. The other pair 42, has a common cathode bias resistor 44. The first or sensing tube 45 of the first pair 41 has its grid 47 connected to the output of the binary counter 20. The first or sensing tube 46 of the second pair has its grid 48 coupled to the storage capacitor 52. The cathode bias resistor 43 of the first pair 41 is connected to a selector switch 60 which has all its odd-numbered positions connected to ground, and has its evenly-numbered positions left unconnected. Thus, in the odd positions of the selector switch as, for example, position 5 shown in Figure 1, the first tube pair 41 is operative, whereas in the evenly-numbered positions it is not.

The common cathode resistor 44 of the second pair is connected to an adjustable voltage divider 62 which is connected across a voltage source. This may be considered as an adjustable bias. The grid 58 of the coincidence tube 56 of the second pair 42 is also connected through a grid resistor 54 to an adjustable voltage divider 64 connected across a source of voltage. The two adjustable biases 62, 64 and the selector switch 60 are ganged so that they are simultaneously adjustable. The biases are adjusted so that the sensing or first tube 46 of the second pair 42 is non-conductive and the coincidence or second tube 56 conductive until a desired count or number of pulses has been impressed upon the energy storage step counter 50 at which time the voltage on the storage capacitor 52 overcomes the bias preventing the sensing tube of the second pair from conducting. The sensing tube 46 then becomes conductive and the cathode applied bias thereupon renders the coincidence tube 56 non-conductive. This switching action between sensing and coincidence tubes in a pair is further aided by a coupling between the anode of the sensing tube and the grid of the coincidence tube which includes a resistor and a capacitor connected in shunt.

In evenly-numbered positions of the selector switch and the ganged biases, the first tube pair is inoperative and the energy storage step counter of the circuit functions in the same manner described in the patent to Luck et al. The ganged adjustable biases may be adjusted so that any one of 10 counts may be selected to switch conduction from the coincidence to the sensing tube. In the oddly-numbered positions, the first tube pair is operative and the circuit functions in a novel manner to make it possible to frequency divide by 20 different factors instead of 10. However, the energy storage step counter functions in the known manner and is still utilized to sense only 10 counts or steps.

In order to explain the novel operation, it will be assumed that the ganged switches are in an odd position, namely, 5. This is as shown in Figure 1. Reference will be made to the voltage wave forms shown in Figure 2, which occur during the operation of the circuit shown in Figure 1 when the ganged switches and biases are in the 5 position. This, as will be more fully explained, provides a frequency division of 5.

A sinusoidal voltage having a wave form *a* is applied to the first limiter 10 input. The first limiter 10 provides a square-wave output voltage having a wave form *b*. The square wave voltage of the first limiter 10 output is differentiated to provide a voltage having a wave form *c* which is applied to the binary counter 20 input. The negative pulses of the input voltage are effective through separate rectifiers to trigger the binary counter 20 alternately from one of its counts to the other. The binary counter 20 provides a square-voltage *d* which appears regular until the fifth count when, as will be explained, the binary counter is reset. The binary counter 20 output is applied to the second limiter 30 which has an output having a voltage wave shape *e* which is 180 degrees out of phase with the binary counter output voltage. The second limiter 30 output is applied to the energy storage step counter 50 and causes the storage capacitor 52 to charge according to a count-representing voltage *f*. This appears as the well-known "staircase" voltage characteristic of energy storage counters until reset occurs at point 5. The binary counter 20 output is also applied to the input of the sensing tube 45 of the first pair of tubes. When the binary output goes positive, the sensing tube 45 conducts and cuts off conduction in the associated coincidence tube 55. As a result, the voltage wave shape *g* at the coincidence tube 55 output of the first pair has the same shape as the voltage wave shape *d* of the binary counter output. Whenever the binary counter output goes positive, the coincidence tube 55 of the first pair is put in a zero current condition. The stair-case voltage *f* is applied to the sensing tube 46 of the second pair. With the adjustable biases in the 5 position, the sensing tube 46 does not become conductive until two pulses have been stored by the storage capacitor 52. This corresponds to a count of two in the energy storage step counter 50 and shows the occurrence of four input pulses or cycles. When the sensing tube 46 becomes conductive the associated coincidence tube 56 becomes non-conducting. The output of the coincidence tube 56 of the second pair has a voltage wave shape *h* which shows a count detecting or zero current condition after an even count which is one less than the particular count selected, or specifically after four pulses have been counted. The ouput of the two coincidence tubes 55 and 56 is derived from a common anode load resistor 70 which is connected to B+. It is only when both coincidence tubes are in a detecting or zero current condition that an output shown by waveshape *i* is derived and applied to the reset and output pulse circuit 80. The point of this occurrence can be found by observing the combined output of the two coincidence tubes as shown by the voltage wave form *i*. It can be seen that the voltage wave form *i* provides coincidence pulses at the desired position 5. The coincidence pulses are applied to the reset and output pulse circuit 80 which provides output pulses having a voltage wave form *j*. Reset pulses are also derived from this circuit and are coupled to separate reset circuits 91, 92 which are respectively associated with the binary counter 20 and the energy storage step counter 50. Each of these reset circuits functions to restore its associated counter to a zero count position. In other words, the binary counter 20 is triggered to its start position and the energy storage capacitor 52 is discharged. It can readily be seen that the output pulses *j* have the desired submultiple frequency.

While the invention has been described as a frequency divider, it functions in a similar manner as a predetermined counter. Thus, with the selector switch and adjustable biases set in the 5 position, a control or output pulse is derived after a count of five.

Although, by way of example, only two counter stages have been shown, the invention is not so limited. For example, a multistage bi-quinary counter can be devised by cascading a plurality of binary and step-of-five energy storage counters; or, further fractional subdivision is possible in the system shown in the above-identified patent to Luck et al. if the ten-step energy storage counter stages are separated by binary counters in the manner herebefore described.

The limiter stages, reset circuits and reset and output pulse circuit have not been described with particularity because such circuits are well known. A more detailed explanation of all but the first limiter circuit may be found in the patent to Luck et al. The first limiter is shown as having two triode stages, each of which functions as a grid limiter to clip half of the input sinusoid. This could be replaced by any suitable limiter such as is described in the above indicated book by Reich on pages 333 and 334.

From the foregoing description, it will be readily apparent that the invention provides a simple, stable frequency divider or predetermined counter of the energy storage step counter type which has a broad counting or frequency dividing range.

What is claimed is:

1. A frequency divider comprising, in combination, a bistable type counter having an input and an output, and an energy storage counter having an input and an output, means to apply pulses at a frequency to be divided to said bistable type counter input, means coupling said bistable type counter output to said energy storage counter input, adjustable means coupled to said bistable type counter and to said energy storage counter outputs to detect the arrival of each at a predetermined count and means to restore said bistable type counter and said energy storage counter to a starting condition responsive to said detecting means.

2. A frequency divider comprising a bistable type counter and an energy storage counter, means for applying a series of pulses to said bistable type counter having a first frequency, said bistable type counter being responsive to alternate ones of said series to produce an output pulse series having a frequency equal to one half of said first frequency, means coupling the output of said bistable type counter to the input of said energy storage counter, said energy storage counter including a storage capacitor that is charged up in steps in response to the application of said series of output pulses, adjustable means coupled to said bistable type counter and to said energy storage counter to detect the arrival of each of said counters at a predetermined count, means responsive to a coincidence in detection by said detecting means to generate a reset and an output pulse, and means for applying said reset pulse to each of said counters to reset them to their initial position.

3. A frequency divider as recited in claim 1 wherein said adjustable detecting means includes a first and a second electron discharge tube each having at least a cathode an anode, and a control grid, said first tube having its grid coupled to the output of said bistable type counter and said second tube having its grid coupled to said storage capacitor, separate adjustable bias means for each of said tubes coupled to the cathodes of said tubes, said bias for said first tube being adjustable to maintain said first tube substantially non-conductive until the storage received from said bistable type counter and said bias for said second tube being adjustable to maintain said second tube substantially non-conductive until the storage capacitor is charged up by the application of a predetermined number of pulses; and wherein said adjustable means to detect a predetermined count includes means responsive to the conduction in said first and second tubes.

4. A frequency divider as recited in claim 1 wherein said bistable type counter includes a pair of electron discharge tubes each having at least a cathode, an anode, and a control grid, said tubes being connected to have energizing potential applied to their anodes through separate resistors, the anode of each tube being cross-connected to the grid of the other tube such that current conduction is stable through either one of said pair of tubes.

5. A predetermined counter comprising a binary counter and an energy storage step counter, said binary counter including a first and a second electron discharge tube each having at least a cathode, an anode, and a control grid, a coupling between the anode of each tube and the grid of the other such that current conduction is stable through either one of said tubes, said energy storage step counter including a storage capacitor that is charged up in steps in response to a series of pulses, means for applying a series of pulses to the grid of said first tube, means for deriving a second series of pulses having one half the number of pulses of said first series from the anode of said second tube, means coupling said second pulse series deriving means to said energy storage step counter, adjustable means coupled to said binary counter and to said energy storage step counter for detecting the arrival of each at a predetermined count, said detecting means including first and second pairs of electron discharge tubes each having a first and a second tube, each tube having at least a cathode, an anode, and a control grid, a separate cathode bias resistor for each pair of tubes having one end to which the cathodes of each tube in a pair is connected, a first adjustable bias means for each pair of tubes connected to the other end of an associated one of said cathode bias resistors, a coupling between the grid of the first tube of the first pair and the output of said scale-of-two counter, a fixed bias connected to the grid of the second tube of the first pair, a second adjustable bias means connected to the grid of the first tube of said second pair, a connection between the grid of the second tube of said second pair and said storage capacitor, means responsive to a coincidence in detection by said detecting means to generate a reset and an output pulse, and means to apply said reset pulse to each of said counters to reset them to their initial position.

6. A predetermined counter as recited in claim 5 wherein said energy storage counter includes a blocking oscillator comprising an electron discharge tube having anode, cathode, and grid electrodes, a cathode follower tube having anode, cathode and grid electrodes, a cathode bias resistor, said blocking oscillator cathode and said cathode follower tube cathode being connected together and to said cathode bias resistor, and means to apply a bias to said cathode follower grid to compensate the threshold bias applied to said blocking oscillator for variations in anode supply voltage.

7. A frequency divider comprising, in combination, a bistable type counter having an input and an output, and an energy storage counter having an input and an output, said energy storage counter including a storage capacitor that is charged up in steps in response to a series of pulses, means to apply a first series of pulses at a frequency to be divided to said bistable type counter input, means for deriving a second series of pulses having one half the number of pulses of said first series from said bistable type counter, means coupling said bistable type counter output to said energy storage counter input, adjustable means coupled to said bistable type counter and to said energy storage counter outputs to detect the arrival of each at a predetermined count, means to restore said bistable type counter and said energy storage counter to a starting condition responsive to said detecting means, said adjustable means coupled to said counters including a first and a second pair of electron discharge tubes each having a first and a second tube, each tube in said pairs having at least a cathode, an anode, and a control grid, a separate cathode bias resistor for each pair of tubes having one end to which the cathodes of each tube in a pair is connected, a first adjustable bias means for each pair of tubes connected to the other end of an associated one of said cathode bias resistors, a coupling between the grid of the first tube of the first pair and the output of said bistable type scale-of-two counter, a fixed bias connected to the grid of the second tube of the first pair, a second adjustable bias means connected to the grid of the first tube of said second pair, and a connection between the grid of the second tube of said second pair and said storage capacitor.

References Cited in the file of this patent

UNITED STATES PATENTS

| | | |
|---|---|---|
| 2,420,516 | Bischoff | May 13, 1947 |
| 2,472,774 | Mayle | June 7, 1949 |
| 2,474,266 | Lyons | June 28, 1949 |
| 2,521,774 | Bliss | Sept. 12, 1950 |
| 2,562,694 | Brown | July 31, 1951 |
| 2,563,123 | Luck et al. | Aug. 7, 1951 |
| 2,709,770 | Hansen | May 31, 1955 |